United States Patent [19]
Ono et al.

[11] Patent Number: 5,734,670
[45] Date of Patent: Mar. 31, 1998

[54] SEMICONDUCTOR DEVICE, SEMICONDUCTOR LASER, AND HIGH ELECTRON MOBILITY TRANSISTOR

[75] Inventors: Kenichi Ono; Takashi Motoda, both of Tokyo, Japan

[73] Assignee: Mitsubishi Denki Kabushiki Kaisha, Tokyo, Japan

[21] Appl. No.: 632,149

[22] Filed: Apr. 15, 1996

[30] Foreign Application Priority Data

Oct. 11, 1995 [JP] Japan ................... 7-263306

[51] Int. Cl.$^6$ ............... H01S 3/19; H01L 29/06
[52] U.S. Cl. ............... 372/45; 372/43; 372/44; 372/50; 257/15; 257/18
[58] Field of Search ............... 372/43, 44, 45, 372/50; 257/15, 17, 18, 19, 185, 190, 191, 201

[56] References Cited

U.S. PATENT DOCUMENTS

| | | | |
|---|---|---|---|
| 5,011,550 | 4/1991 | Konushi et al. | 148/33.5 |
| 5,306,924 | 4/1994 | Usami et al. | 257/18 |
| 5,308,995 | 5/1994 | Tsuji et al. | 257/17 |
| 5,369,292 | 11/1994 | Yoo et al. | 257/186 |
| 5,629,231 | 5/1997 | Kiehl | 438/509 |

FOREIGN PATENT DOCUMENTS 6-69589  3/1994  Japan .................. 372/43 X

OTHER PUBLICATIONS

"High Power, Low Threshold, Singlemode 630nm Laser Diodes", Geels et al., Electronics Letters, vol. 28, No. 19, Sep. 10, 1992.

"Lateral modulations in zero–net–strained GaInAsP multilayers grown by gas source molecular–beam epitaxy" A. Ponchet et al., J. Appl. Phys. 74 (6), 15 Sep. 1993, pp. 3778–3782.

Smowton et al., "Threshold Current of 670–nm AlGaInP Strained Quantum Well Lasers", IEEE Photonics Technology Letters, vol. 4, No. 8, Aug. 1994, pp. 910–912.

Aoki et al., "High–Power and Wide–Temperature–Range Operations of InGaAsP–InP Strained MQW Lasers with Reverse–Mesa Ridge–Wave–guide Structure", IEEE Photonics Technology Letters, vol. 7, No. 1, Jan. 1995, pp. 13–15.

Tanaka et al., "Study on Strain–Induced Polarization Mode of Strained–Layer Quantum–Well 630–nm AlGaInp LD's", IEEE Photonics Tech. Letters, vol. 7, No. 2, Feb. 1995, pp. 136–139.

Agahi et al, "High–Performance 770–nm AlGaAs–GaAsp Tensile–Strained Quantum–Well Laser Diodes", IEEE Photonics Tech. Letters, vol. 7, No. 2, Feb. 1995, pp. 140–143.

Yoshida et al. "Low Threshold Current Density Operation of GaInP–AlGaInP Visible Multiple Quantum Wire–Like Lasers . . . "IEEE Photonics Tech. Letters, vol. 7, No. 4, Apr. 1995, pp. 241–243.

Shin et al., "Temperature Dependences of $Ga_{0.34}In_{0.34}As$–InP Tensile–Strained Quasi–Quantum–Wire Laser Fabricated by Wet Chemical Etching and 2–Step OMVPE Growth", IEEE Photonics Tech. Letters, vol. 7, No. 4, Apr. 1995, pp. 345–347.

Godefroy et al., "1.55–μm Polarization–Insensitive Optical Amplifier with Strain–Balanced Superlattice Active Layer", IEEE Technology Letters, vol. 7, No. 5, May 1995, pp. 473–475.

*Primary Examiner*—Brian Healy
*Attorney, Agent, or Firm*—Leydig, Voit & Mayer, Ltd.

[57] ABSTRACT

A semiconductor device includes a semiconductor substrate having a surface; and a strained superlattice structure including first semiconductor layers having a first strain in a direction with respect to the semiconductor substrate and second semiconductor layers having a second strain in the same direction as and different in magnitude from the first strain, the first semiconductor layers and the second semiconductor layers being alternatingly laminated. The difference in strains between the first semiconductor layers and the second semiconductor layers is reduced, so that the crystalline quality of the strained superlattice structure is improved.

11 Claims, 14 Drawing Sheets

SEMICONDUCTOR DEVICE, SEMICONDUCTOR LASER, AND HIGH ELECTRON MOBILITY TRANSISTOR

FIELD OF THE INVENTION

The present invention relates to semiconductor devices, semiconductor lasers, and high electron mobility transistors and, more particularly, to those including strained superlattice structures.

BACKGROUND OF THE INVENTION

For semiconductor lasers oscillating in the 600 μm band, several methods have been proposed to make the oscillating wavelength shorter. One effective method is applying a strain in a tensile direction with respect to a substrate (hereinafter referred to as a tensile strain) to a well layer in an MQW (multiquantum well) active layer, in other words, applying a strain to a crystalline structure having a lattice constant smaller than that of the substrate. For example, it is reported in Electronics Letters, Vol. 28, No. 19, 1992, pp. 1810–1811 that a single mode laser diode emitting in the 630 μm band is achieved by this method.

FIG. 10(a) is a cross-sectional view illustrating a prior art buried ridge type semiconductor laser including an MQW active layer to which a tensile strain is applied (hereinafter referred to as a tensively strained MQW active layer). FIG. 10(b) is an enlarged view of a part of the laser denoted by C in FIG. 10(a). The semiconductor laser includes an n type GaAs substrate 1. An n type $(Al_{x1}Ga_{1-x1})_{y1}In_{1-y1}P$ (x1=0.7, y1=0.5) lower cladding layer 2 is disposed on the n type GaAs substrate 1. An MQW active layer 30 is disposed on the lower cladding layer 2. The MQW active layer 30 comprises an MQW structure 31, and $(Al_{x2}Ga_{1-x2})_{y2}In_{1-y2}P$ (x2=0.5, y2=0.5) SCH (Separate Confinement Heterostructure) layers 3 and 5 sandwiching the MQW structure 31. In the MQW structure 31, four $(Al_{x8}Ga_{1-x8})_{y8}In_{1-y8}P$ (0≦x8≦0.2, y8=0.6) well layers 31a, each having a thickness of about 60 Å, and three $(Al_{x9}Ga_{1-x9})_{y9}In_{1-y9}P$ (x9=0.5, y9=0.5) barrier layers 31b, each having a thickness of about 80 Å, are alternatingly laminated. A p type $(Al_{x1}Ga_{1-x1})_{y1}In_{1-y1}P$ (x1=0.7, y1=0.5) upper cladding layer 6 having a ridge in the center of the structure is disposed on the MQW active layer 30. N type GaAs current blocking layers 7 are disposed on the upper cladding layer 6, contacting both sides of the ridge. A p type GaAs contact layer 8 is disposed on the top of the ridge and on the n type GaAs current blocking layers 7. The contact layer 8 comprises first and second contact layers 8a and 8b. A p side electrode 9 is disposed on the contact layer 8 and an n side electrode 10 is disposed on the rear surface of the substrate 1.

A description is given of the operation. When a forward bias voltage is applied across the p side electrode 9 and the n side electrode 10, holes are injected into the active layer 30 from the p side electrode 9 through the p type contact layer 8 and the p type upper cladding layer 6, and electrons are injected into the active layer 30 from the n side electrode 10 through the n type substrate 1 and the n type lower cladding layer 2. In the active layer 30, electrons and holes recombine to generate induced light emission, and the emitted light is guided along the SCH layers 3 and 5. When the amount of the injected carriers is sufficient to produce light exceeding loss in the waveguide, laser oscillation occurs.

FIG. 11 is a schematic diagram for explaining a strain applied to the crystalline structure in the vicinity of the active layer 30. In the figure, the same reference numerals as those shown in FIGS. 10(a) and 10(b) designate the same or corresponding parts. The abscissa shows the layer-laminated direction in the MQW structure 31, and the ordinate shows the strain applied to the MQW structure 31 with respect to the substrate 1.

In the prior art semiconductor laser, as shown in FIG. 11, although the lattice constant of the barrier layers 31b of the MQW structure 31 approximates the lattice constant of the substrate 1, i.e., the strain is approximately zero, since the lattice constant of the well layers 31 is smaller than the lattice constant of the substrate 1, a tensile strain is applied with respect to the substrate 1.

When the thicknesses of the well layers 31a and the barrier layers 31b are increased according to the design of the active layer in the state where the strain is applied to the superlattice structure, the thickness of the active layer 30 may exceed a critical thickness at which dislocations occur as a result of a stress applied to the crystalline structure of the active layer due to the MQW structure 31. Once such dislocations occur, desired laser characteristics cannot be obtained.

This problem is solved in another prior art semiconductor laser having an MQW structure shown in figure 12. In the figure, the same reference numerals as those shown in FIG. 11 designate the same or corresponding parts. As shown in FIG. 12, this semiconductor laser includes an MQW structure 32 comprising four $Ga_{0.6}In_{0.4}P$ well layers and three $(Al_{0.5}Ga_{0.5})_{0.4}In_{0.6}P$ barrier layers which are alternatingly laminated. The abscissa shows the layer-laminated direction in the MQW structure 32, and the ordinate shows the strain applied to the MQW structure 32 with respect to the substrate. The constituents other than the MQW structure 32 are identical to those shown in FIG. 10(a).

In the MQW structure 32 shown in FIG. 12, a tensile strain is applied to the well layers 32a while a compressive strain is applied to the barrier layers 32b, i.e., the MQW structure 32 has a strain compensation type superlattice structure. Therefore, the total strain in the MQW structure 32 is reduced by the well layers 32a and the barrier layers 32b, whereby the critical thickness is increased as compared with the laser structure shown in FIG. 11. This strain compensation type MQW structure has been generally employed.

However, a tensile strain applied to the MQW structure 31 or 32 of the prior art semiconductor laser easily adversely affects the crystalline quality as compared with a compressive strain.

FIG. 13(a) is a graph illustrating the relationship between the strain in the MQW structure and the photoluminescence intensity, and FIG. 13(b) is a graph illustrating the relationship between the strain in the MQW structure and the carrier lifetime of the photoluminescence. In FIG. 13(a), the abscissa shows the strain in the well layer, and the ordinate shows the photoluminescence intensity (a.u.). In FIG. 13(b), the abscissa shows the stain in the well layer, and the ordinate shows the carrier lifetime (ns). When the value on the abscissa is 0, no strain is applied to the well layer. When the value is negative, a tensile strain is applied. When the value is positive, a compressive strain is applied. These data are obtained by measuring photoluminescence produced in a sample structure shown in FIG. 14. This sample structure comprises an n type GaAs substrate 101, an intrinsic (hereinafter referred to as i type) GaAs buffer layer 102, an i type $(Al_{0.5}Ga_{0.5})_{0.5}In_{0.5}P$ buffer layer 103, an MQW structure 104 comprising, alternatingly laminated, four i type $(Al_{0.5}Ga_{0.5})_{0.5}In_{0.5}P$ barrier layers (not shown), each having a thickness of 80 Å, and four i type $Ga_xIn_{1-x}P$ well layers (not shown), each having a thickness of 80 Å, and an i type GaAs cap layer 105. In this sample, the strain of the well layer is controlled with the In composition 1-z of the well layer. That is, when the In composition 1-z is larger than 0.5 a compressive strain is applied to the crystalline structure. When it is smaller than 0.5, a tensile strain is applied. The i type GaAs cap layer 105 is removed when the photoluminescence is measured.

As shown in FIGS. 13(a) and 13(b), with an increase in the tensile strain of the well layer, both the photoluminescence intensity and the carrier lifetime are reduced. Since the reduction in the photoluminescence intensity and the reduction in the carrier lifetime are caused by degradation of the crystalline quality, it is proved that the tensile stain degrades the crystalline quality.

There are few articles describing degradation of crystalline quality due to a tensile strain. In Japanese Applied Physics Letters, Vol. 74, 1993, p. 3778, A. Ponchet et al. reported that, in a strain compensation type MQW structure comprising compressively strained well layers and tensively strained barrier layers, the tensively strained barrier layers cause a three-dimensional crystal growth that makes the surface of the structure uneven.

FIG. 16 is a cross-sectional view illustrating a prior art high electron mobility transistor (hereinafter referred to as an HEMT). This HEMT includes a semi-insulating GaAs substrate 21. An undoped GaAs buffer layer 22 is disposed on the substrate 21. An undoped GaAs electron transit layer 23 is disposed on the buffer layer 22. An undoped InGaAs pseudo electron transit layer 24 having a compressive strain with respect to the substrate 21 is disposed on the electron transit layer 23. An $n^+$ type AlGaAs electron supply layer 25 is disposed on the pseudo electron transit layer 24. Ohmic regions 29 are created within the laminated structure, reaching the surface of the electron supply layer 25. Preferably, the ohmic regions 29 are produced by ion implantation of Si. A gate electrode 27 is disposed on a center portion of the electron supply layer 25. A source electrode 28 and a drain electrode 26 are disposed on the electron supply layer 25, contacting the respective ohmic regions 29.

A description is given of the operation of the HEMT. This HEMT is a pseudomorphic HEMT including a pseudo electron transit layer 24 between an electron supply layer 25 and an electron transit layer 23. Electrons generated from donor impurities in the electron supply layer 25 are spatially separated from donor ions and accumulated in the pseudo electron transit layer 24 between the electron supply layer 25 and the electron transit layer 23 to produce a channel, and electrons traveling in the channel between the source electrode 28 and the drain electrode 26 are controlled with a voltage applied to the gate electrode 27. Since donor ions that prevent electrons from traveling are not present in the channel, a high mobility of electrons is realized. In addition, since the channel is produced in the In-added pseudo electron transit layer 24, the electron mobility of the HEMT is further increased.

Although the electron mobility in the pseudo electron transit layer 24 is increased by adding In to GaAs, since the InGaAs pseudo electron transit layer 24 is not lattice-matched with the GaAs substrate 21, a strong compressive strain is applied to the pseudo electron transit layer 24. Therefore, the crystalline quality of the pseudo electron transit layer 24 is degraded, whereby the characteristics of the HEMT are degraded. For example, the electron mobility in the pseudo electron transit layer 24 is reduced.

As described above, in the prior art semiconductor device including the strained superlattice structure, such as a strained MQW structure, the crystalline quality is degraded due to the strain of the superlattice structure. As a result, it is very difficult to provide a high quality semiconductor device with desired characteristics.

Therefore, when such a strained MQW structure is employed for an active layer of a semiconductor laser, a semiconductor laser with desired characteristics cannot be obtained.

In the prior art HEMT including the pseudo electron transit layer, since a strong compressive strain is applied to the pseudo electron transit layer, the crystalline quality of the pseudo electron transit layer is degraded, whereby the electron mobility in the pseudo electron transit layer is reduced. As a result, it is difficult to provide a HEMT with desired characteristics.

SUMMARY OF THE INVENTION

It is an object of the present invention to provide a semiconductor device including a strained superlattice structure with high crystalline quality.

It is another object of the present invention to provide a semiconductor laser including a strained MQW active layer with high crystalline quality.

It is still another object of the present invention to provide a HEMT including a pseudo electron transit layer with high crystalline quality.

Other objects and advantages of the invention will become apparent from the detailed description that follows. The detailed description and specific embodiments described are provided only for illustration since various additions and modifications within the scope of the invention will be apparent to those of skill in the art from the detailed description.

According to a first aspect of the present invention, a semiconductor device includes a semiconductor substrate having a surface; and a strained superlattice structure comprising a plurality of first semiconductor layers having a first strain in a compressive or tensile direction with respect to the semiconductor substrate and a plurality of second semiconductor layers having a second strain in the same direction as and different in quantity from the first strain, wherein the first semiconductor layers and the second semiconductor layers are alternatingly laminated. Therefore, the difference in strains between the first semiconductor layer and the second semiconductor layer is reduced, resulting in a semiconductor device including a strained superlattice structure having a good crystalline quality.

According to a second aspect of the present invention, the semiconductor device further includes a pair of third semiconductor layers sandwiching the strained superlattice structure. The third semiconductor layers have a third strain in the same direction as the first strain with respect to the substrate, and the third strain gradually increases toward the strained superlattice structure. Therefore, the difference in strains between the superlattice structure and the third semiconductor layer is reduced, resulting in a semiconductor device including a strained superlattice structure having a good crystalline quality. According to a third aspect of the present invention, in the semiconductor device, the second semiconductor layers have a fourth strain in the same direction as the first strain with respect to the substrate, wherein the absolute value of a difference between the fourth strain and the first strain gradually decreases toward the first semiconductor layer. Therefore, the difference in strains between the second semiconductor layer and the first semiconductor layer at the interface of these layers is reduced, resulting in a semiconductor device including a strained superlattice structure having a good crystalline quality.

According to a fourth aspect of the present invention, the semiconductor device further includes a fourth semiconductor layer in the vicinity of the strained superlattice structure. The fourth semiconductor layer is parallel to the surface of the substrate and has a fifth strain in the opposite direction to the direction of the first strain. In this structure, since the strain in the strained superlattice structure is relaxed by the fourth semiconductor layer, the critical thickness of the strained superlattice structure is increased. Therefore, the thickness of the strained superlattice structure can be increased, resulting in a semiconductor device providing a high degree of freedom in design.

According to a fifth aspect of the present invention, a semiconductor laser comprises a semiconductor substrate of a first conductivity type and having opposed front and rear surfaces; a first cladding layer of the first conductivity type disposed on the front surface of the semiconductor substrate, the first cladding layer having no strain with respect to the semiconductor substrate and having a band gap energy; an active layer comprising a pair of separate confinement heterostructure layers disposed on the first cladding layer and a strained superlattice structure interposed between the separate confinement heterostructure layers, the separate confinement heterostructure layers comprising a material having a band gap energy smaller than the band gap energy of the first cladding layer, the strained superlattice structure comprising a plurality of well layers having a first strain in a compressive or tensile direction with respect to the semiconductor substrate and a plurality of barrier layers interposed between the well layers and having a second strain in the same direction as and smaller than the first strain; a second cladding layer of a second conductivity type, opposite the first conductivity type, disposed on the active layer and comprising the same material as the first cladding layer; a contact layer of the second conductivity type disposed on the second cladding layer and having no strain with respect to the substrate; a first electrode disposed on the rear surface of the substrate; and a second electrode disposed on the contact layer. Therefore, the difference in strains between the well layer and the barrier layer is reduced, resulting in a semiconductor laser including, in an active layer, a strained superlattice structure having a good crystalline quality.

According to a sixth aspect of the present invention, in the semiconductor laser, the separate confinement heterostructure layers have a third strain in the same direction as the first strain with respect to the substrate, and the third strain gradually increases toward the strained superlattice structure. Therefore, the difference in strains between the SCH layer and the strained superlattice structure is reduced, resulting in a semiconductor laser including, in an active layer, a strained superlattice structure having a good crystalline quality.

According to a seventh aspect of the present invention, in the semiconductor laser, the barrier layers have a fourth strain in the same direction as the first strain with respect to the substrate, wherein the absolute value of a difference between the fourth strain and the first strain gradually decreases toward the well layer. Therefore, the difference in strains between the well layer and the barrier layer at the interface of these layers is reduced, resulting in a semiconductor laser including, in an active layer, a strained superlattice structure having a good crystalline quality.

According to an eighth aspect of the present invention, the semiconductor laser further includes a strain relaxing layer in the vicinity of the strained superlattice structure. The strain relaxing layer is parallel to the surface of the substrate, has a fifth strain in the opposite direction to the direction of the first strain, and comprises a semiconductor material having a conductivity type and a band gap energy identical to those of one of semiconductor layers contacting the strain relaxing layer. In this structure, since the strain in the strained superlattice structure is relaxed by the strain relaxing layer, the critical thickness of the strained superlattice structure in the active layer is increased. Therefore, the thickness of the active layer can be increased, resulting in a semiconductor laser having a high degree of freedom in design.

According to a ninth aspect of the present invention, a high electron mobility transistor comprises a semi-insulating substrate having a surface; an undoped electron transit layer disposed on the surface of the semi-insulating substrate; an undoped pseudo electron transit layer disposed on the electron transit layer and having a first strain in a compressive or tensile direction with respect to the substrate; an electron supply layer disposed on the pseudo electron transit layer and having a high concentration of an n type producing dopant impurity; a gate electrode disposed on a portion of the electron supply layer, making a Schottky contact with the electron supply layer; a source electrode and a drain electrode disposed on portions of the electron supply layer at opposite sides of and spaced apart from the gate electrode, making an ohmic contact with the electron supply layer; and an n type crystalline defect preventing layer interposed between the pseudo electron transit layer and the electron supply layer and having a second strain in the same direction as and smaller than the first strain. Therefore, the difference in strains between the pseudo electron transit layer and the crystalline defect relaxing layer is reduced, resulting in a high electron mobility transistor including a pseudo electron transit layer having a good crystalline quality.

According to a tenth aspect of the present invention, a high electron mobility transistor comprises a semi-insulating substrate having a surface; an undoped electron transit layer disposed on the surface of the semi-insulating substrate; an undoped pseudo electron transit layer disposed on the electron transit layer and having a first strain in a compressive or tensile direction with respect to the substrate; an electron supply layer disposed on the pseudo electron transit layer and having a high concentration of an n type producing dopant impurity; a gate electrode disposed on a portion of the electron supply layer, making a Schottky contact with the electron supply layer; a source electrode and a drain electrode disposed on portions of the electron supply layer at opposite sides of and spaced apart from the gate electrode, making an ohmic contact with the electron supply layer; and an undoped crystalline defect preventing layer interposed between the pseudo electron transit layer and the electron transit layer and having a second strain in the same direction as and smaller than the first strain. Therefore, the difference in strains between the pseudo electron transit layer and the crystalline defect relaxing layer is reduced, resulting in a high electron mobility transistor including a pseudo electron transit layer having a good crystalline quality.

DETAILED DESCRIPTION OF THE PREFERRED EMBODIMENTS

[Embodiment 1]

Figure 1:
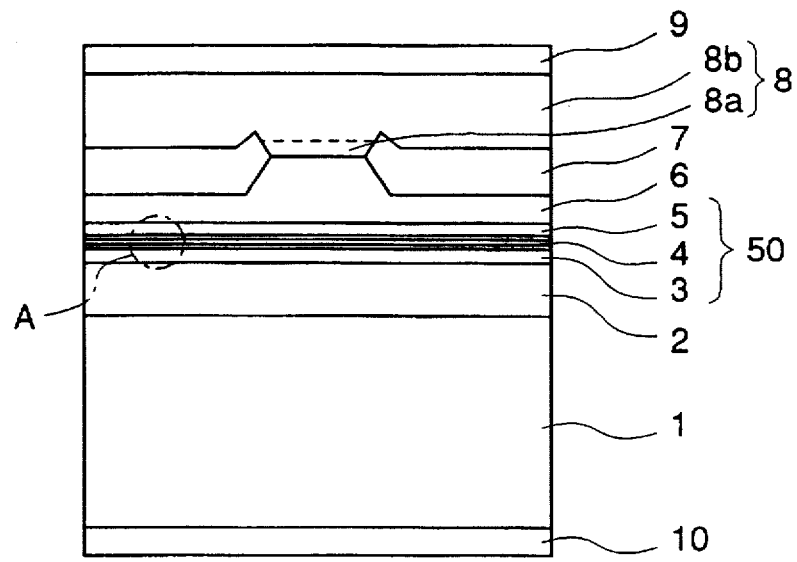
FIG. 1(a) is a cross-sectional view illustrating a semiconductor laser in accordance with a first embodiment of the present invention.
FIG. 1(b) is an enlarged view of a part of the semiconductor laser.
Figure 1:
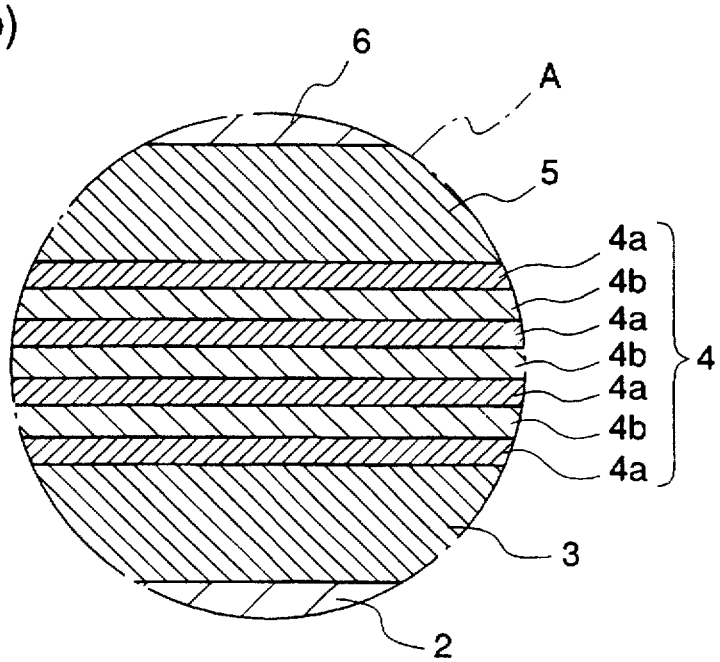

FIG. 1(a) is a cross-sectional view illustrating a prior art semiconductor laser in accordance with a first embodiment of the present invention. FIG. 1(b) is an enlarged view of a part of the laser denoted by A in FIG. 1(a). The semiconductor laser includes an n type GaAs substrate 1 having a lattice constant. An n type $(Al_{x1}Ga_{1-x1})_{y1}IN_{1-y1}P$ (x1=0.7, y1=0.5) lower cladding layer 2 having a lattice constant equivalent to the lattice constant of the substrate 1 is disposed on the substrate 1. An MQW active layer 50 is disposed on the lower cladding layer 2. A p type $(Al_{x1}Ga_{1-x1})_{y1}IN_{1-y1}P$ (x1=0.5) upper cladding layer 6 having a lattice constant equivalent to the lattice constant of the substrate 1 is disposed on the MQW active layer 50. The upper cladding layer 6 has a ridge in the center of the structure. N type GaAs current blocking layers 7 are disposed on the upper cladding layer 6, contacting both sides of the ridge. A p type GaAs contact layer 8 is disposed on the top of the ridge and on the n type GaAs current blocking layers 7. The contact layer 8 comprises first and second contact layers 8a and 8b. A p side electrode 9 is disposed on the contact layer 8, and an n side electrode 10 is disposed on the rear surface of the substrate 1.

In this first embodiment of the invention, the active layer 50 comprises an MQW structure 4, and a pair of SCH (Separate Confinement Heterostructure) layers 3 and 5 sandwiching the MQW structure 4. The SCH layers 3 and 5 comprise a material having a lattice constant equivalent to the lattice constant of the substrate 1 and a band gap energy smaller than the band gap energy of the lower and upper cladding layers 2 and 6, for example, $(Al_{x2}Ga_{1-x2})_{y2}In_{1-y2}P$ (x2=0.5, y2=0.5). In the MQW structure 4, four well layers 4a and three barrier layers 4b are alternatingly laminated. More specifically, each well layer 4a has a thickness of about 60 Å, a band gap energy smaller than the band gap energy of the SCH layers 3 and 5, and a lattice constant smaller than the lattice constant of the substrate 1. A tensile strain is applied to the well layer 4a. Preferably, the well layer 4a comprises $(Al_{x3}Ga_{1-x3})_{y3}In_{1-y3}P$ $0 \leq x3 \leq 0.2$, y3=0.6). Each barrier layer 4b has a thickness of about 80 Å, a band gap energy equivalent to the band gap energy of the SCH layers 3 and 5, and a lattice constant smaller than the lattice constant of the substrate 1 and larger than the lattice constant of the well layer 4a. A tensile strain smaller than the tensile strain applied to the well layer 4a is applied to the barrier layer 4b. Preferably, the barrier layer 4b comprises $(Al_{x4}Ga_{1-x4})_{y4}In_{1-y4}P$ (x4=0.5, y4=0.55). The numbers and thicknesses of the well layers 4a and the barrier layers 4b in the MQW structure 4 are selected according to desired characteristics of the laser, such as the wavelength of light generated, of the semiconductor laser. Generally, in $Al_xGa_{1-x})_yIN_{1-y}P$, the band gap energy is controlled by changing the Al composition x, and the lattice constant is controlled by changing the In composition y, whereby the quantity and direction of the strain are controlled.

Figure 2:
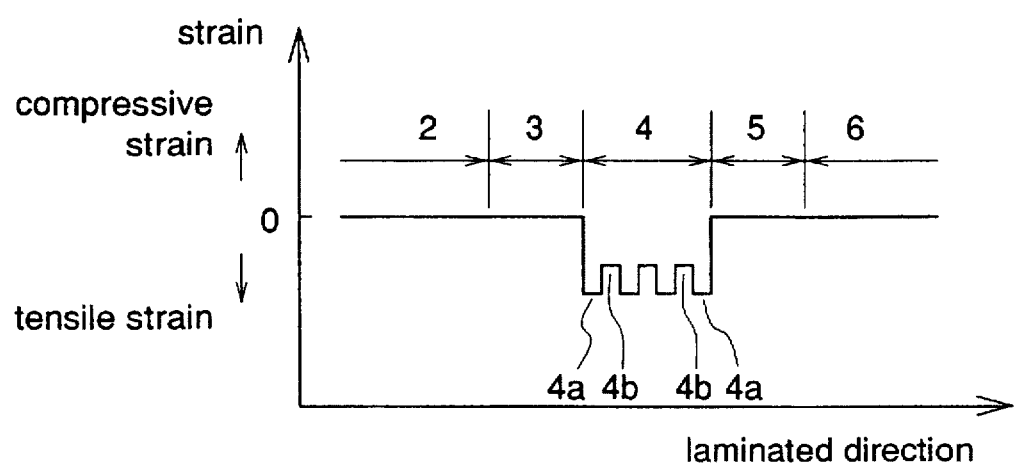
FIG. 2 is a schematic diagram for explaining a strain applied to an active layer and the vicinity in the semiconductor laser according to the first embodiment.

FIG. 2 is a schematic diagram for explaining a strain applied to the active layer 50 and its vicinity. In the figure, the same reference numerals as those in FIGS. 1(a) and 1(b) designate the same or corresponding parts. The abscissa shows the layer-laminated direction in the active layer 50, and the ordinate shows the strain applied to the active layer 50 with respect to the substrate 1.

Figure 3:
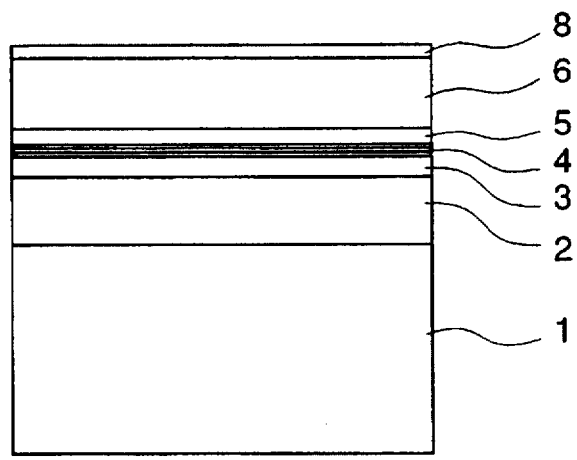
FIGS. 3(a)–3(c) are cross-sectional views illustrating process steps in a method of fabricating the semiconductor laser according to the first embodiment.
Figure 3:
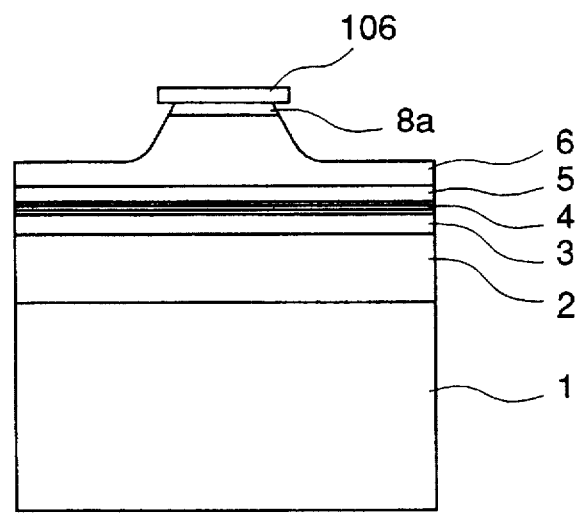
Figure 3:
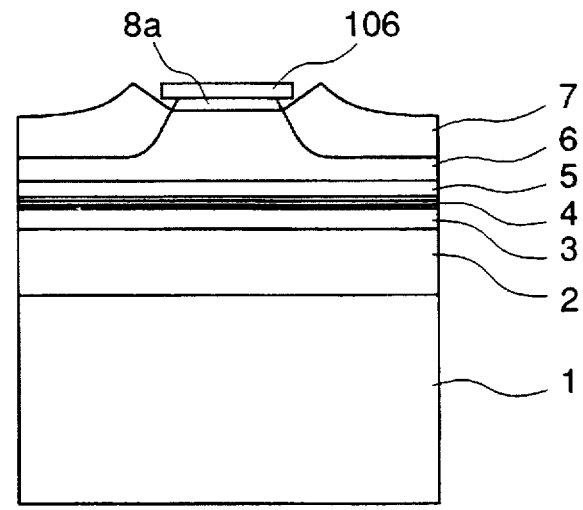

FIGS. 3(a)–3(c) are cross-sectional views illustrating process steps in a method of fabricating the semiconductor laser shown in FIGS. 1(a) and 1(b). In the figures, reference numeral 106 designates an SiO$_2$ film.

In this first embodiment of the invention, strain is defined by $$\Delta a = (a - a0)/a$$

where $\Delta a$ is the strain, a0 is the lattice constant of the semiconductor substrate, and a is the lattice constant of the semiconductor layer. When $0.001 \leq |\Delta a|$, strain is applied to the crystalline structure.

A description is given of the process steps of fabricating the semiconductor laser.

Initially, as illustrated in FIG. 3(a), the lower cladding layer 2, the SCH layer 3, the MQW structure 4, the SCH layer 5, the upper cladding layer 6, and the first contact layer 8a are successively grown on the n type substrate 1 by MOCVD (Metal Organic Chemical Vapor Deposition).

In the step of FIG. 3(b), a stripe-shaped $SiO_2$ film 106 is formed on the first contact layer 8a, and the first contact layer 8a and the upper cladding layer 6 are etched using the $SiO_2$ film 106 as a mask, thereby forming a stripe-shaped ridge structure.

In the step of FIG. 3(c), using the $SiO_2$ film 106 as a mask for selective growth, the n type GaAs current blocking layer 7 is grown on the upper cladding layer 6, contacting both sides of the ridge structure. After removal of the $SiO_2$ film 106 with hydrofluoric acid, the second p type GaAs contact layer 8b is grown on the first contact layer 8a and on the current blocking layer 7. Finally, the p side electrode 9 and the n side electrode 10 are formed on the contact layer 8 and the rear surface of the substrate 1, respectively, to complete the semiconductor laser.

A description is given of operation of the laser. When a forward bias voltage is applied across the p side electrode 9 and the n side electrode 10, holes are injected into the active layer 50 from the p side electrode 9 through the p type contact layer 8 and the p type upper cladding layer 6, and electrons are injected into the active layer 50 from the n side electrode 10 through the n type substrate 1 and the n type lower cladding layer 2. In the active layer 50, electrons and holes recombine to generate induced light, and the emitted light is guided along the SCH layers 3 and 5. When the quantity of the injected carriers is sufficient to produce light exceeding loss in the waveguide, laser oscillation occurs. In regions on both sides of the ridge structure, the p type contact layer 8, the n type current blocking layer 7, and the p type upper cladding layer 6 produce a pnp structure. Therefore, current does not flow in these regions but is concentrated in the stripe-shaped ridge structure, whereby radiative recombination occurs only in a region of the active layer 50 under the ridge structure.

In the semiconductor laser according to the first embodiment of the invention, since the lattice constants of the lower cladding layer 2, the upper cladding layer 6, and the SCH layers 3 and 5 approximate the lattice constant of the substrate 1, the strain in these layers with respect to the substrate 1 is approximately zero. Therefore, it can be said that these layers have no strain with respect to the substrate 1. On the other hand, since the lattice constant of the well layer 4a in the MQW structure 4 is smaller than the lattice constant of the substrate 1, a tensile strain is applied to the well layer 4a. In addition, since the lattice constant of the barrier layer 4b is smaller than the lattice constant of the substrate 1 and larger than the lattice constant of the well layer 4a, a tensile strain, smaller than the tensile strain applied to the well layer 4a, is applied to the barrier layer 4b.

Figure 4:
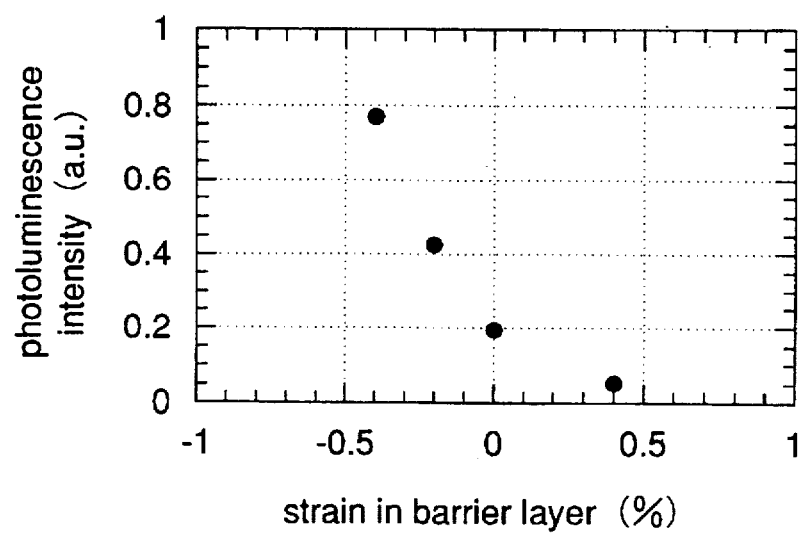
FIGS. 4(a) and 4(b) are graphs for explaining the effects provided by the semiconductor laser according to the first embodiment of the invention.
Figure 4:
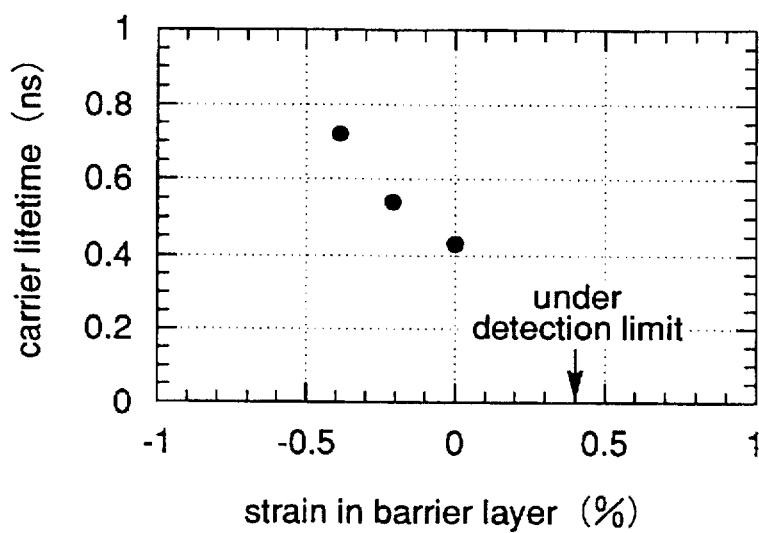
Figure 15:
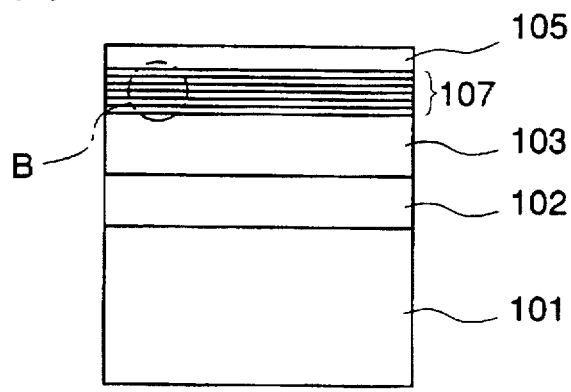
FIGS. 15(a) and (b) are cross-sectional views illustrating a sample structure for explaining an MQW structure according to the present invention.
Figure 15:
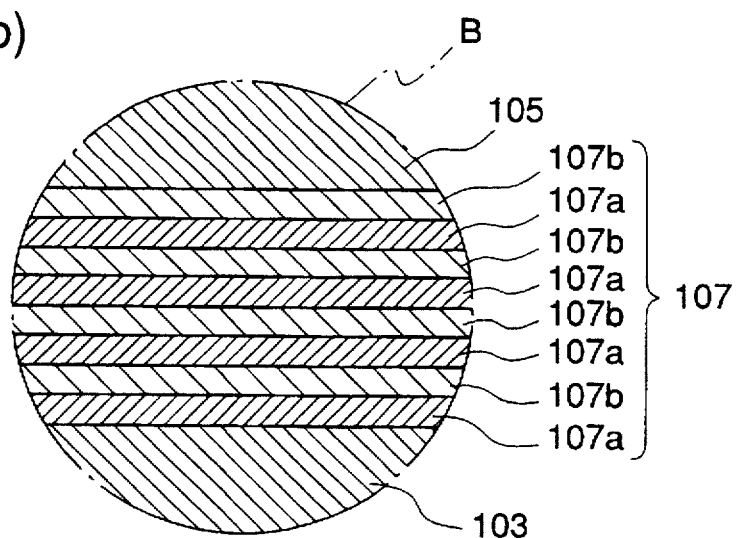

FIGS. 4(a) and 4(b) are graphs illustrating the relationship between photoluminescence intensity and strain in a barrier layer and the relationship between lifetime of photoluminescence and strain in a barrier layer, respectively, in a superlattice structure in which well layers and barrier layers having different strains are alternatingly laminated. In FIG. 4(a), the abscissa shows the strain in the barrier layer, and the ordinate shows the photoluminescence intensity (a.u.). In FIG. 4(b), the abscissa shows the strain in the barrier layer, and the ordinate shows the carrier lifetime (ns). When the value on the abscissa is 0, no strain is applied to the barrier layer. When the value is negative, a tensile strain is applied to the barrier layer. When the value is positive, a compressive strain is applied to the barrier layer. These data are obtained by measuring photoluminescence produced in a sample structure shown in FIGS. 15(a) and 15(b). FIG. 15(a) is a cross-sectional view of the sample structure, and FIG. 15(b) is an enlarged view of a part of the sample structure denoted by B in FIG. 15(a). The sample structure comprises an n type GaAs substrate 101, an i type GaAs buffer layer 102, an i type $(Al_{0.5}Ga_{0.5})_{0.5}In_{0.5}P$ buffer layer 103, an MQW structure 107, and an i type GaAs cap layer 105. As shown in FIG. 15(b), the MQW structure 107 comprises, alternatingly laminated, four i type $Ga_{0.6}In_{0.4}P$ well layers 107 each having a thickness of 80 Å and four i type $(Al_{0.5}Ga_{0.5})_w In_{1-w}P$ barrier layers 107b each having a thickness of 80 Å. The thickness of the MQW structure 107 does not exceed a critical thickness. In this sample, the strain of the barrier layer 107b is controlled by changing the In composition 1-w of the barrier layer. When the In composition 1-w is larger than 0.5, a compressive strain is applied to the crystalline structure. When it is smaller than 0.5, a tensile strain is applied. The i type GaAs cap layer 105 is removed when the photoluminescence is measured.

Figure 12:
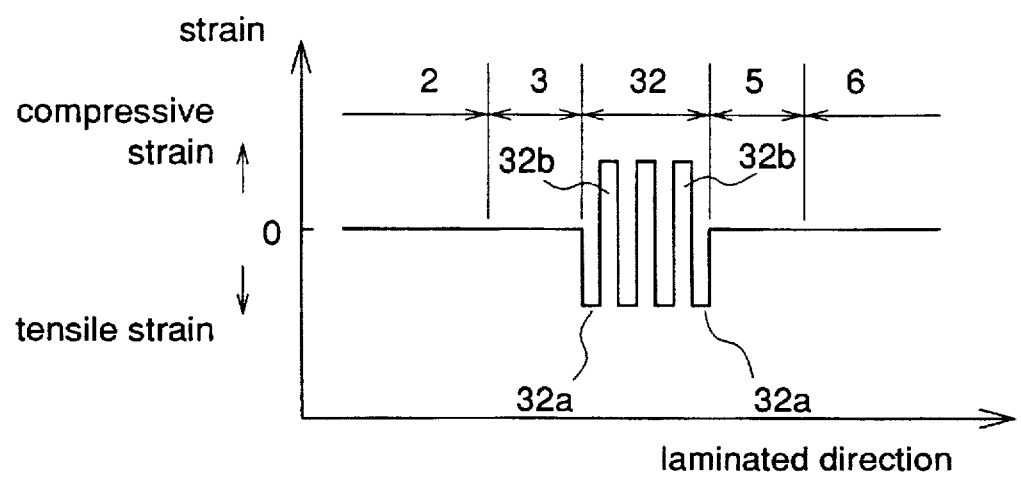
FIG. 12 is a schematic diagram for explaining a strain applied to an active layer and the vicinity in a semiconductor laser according to the prior art.
Figure 13:
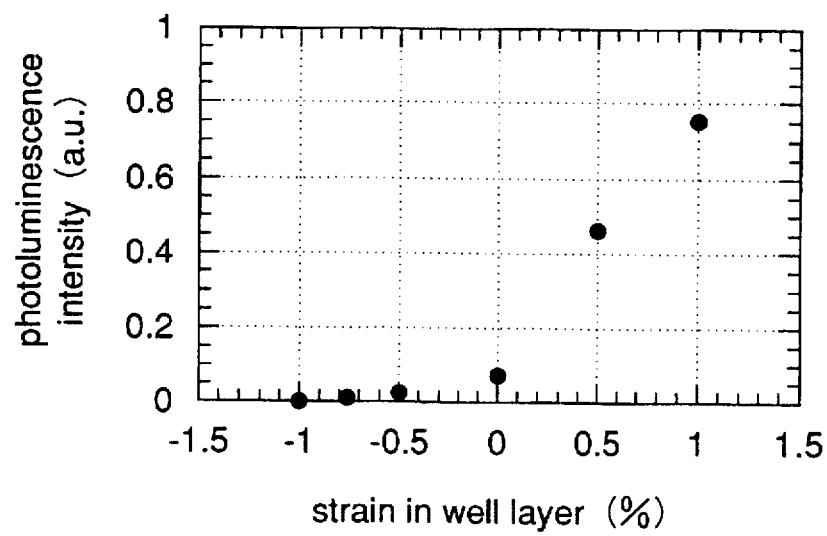
FIGS. 13(a) and 13(b) are graphs for explaining the defects of the semiconductor laser according to the prior art.
Figure 13:
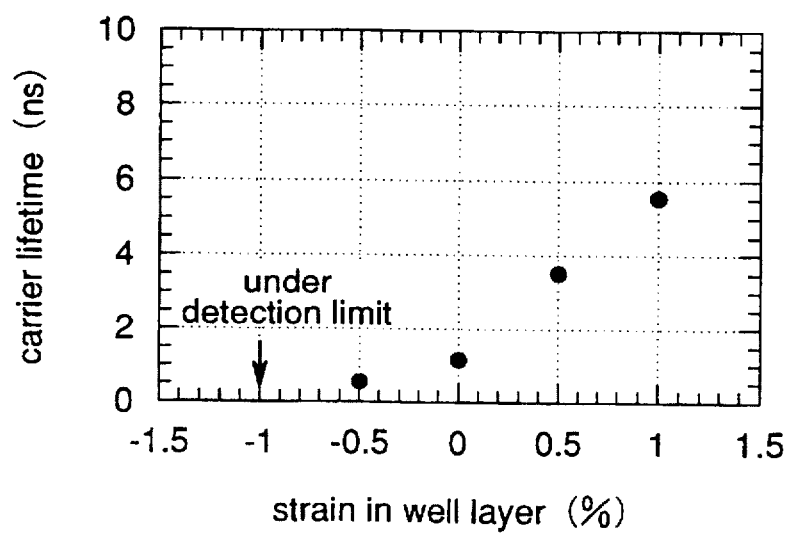
Figure 14:
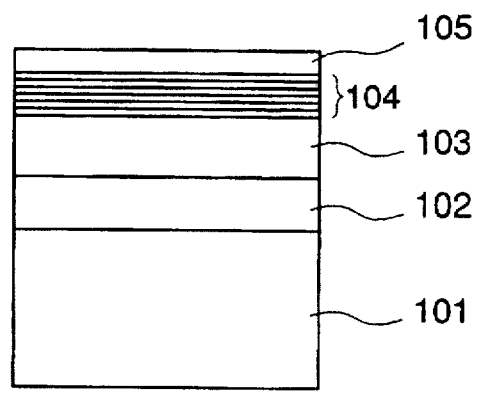
FIG. 14 is a cross-sectional view illustrating a sample structure for explaining an MQW structure according to the prior art.

As seen from FIGS. 4(a) and 4(b), both the photoluminescence intensity and the carrier lifetime are increased as a strain in the same direction as the strain applied to the well layer with respect to the substrate, i.e., the tensile strain, is increased in the barrier layer. To the contrary, both the photoluminescence intensity and the carrier lifetime are decreased as a strain in the opposite direction from the strain applied to the well layer, i.e., a compressive strain, is increased in the barrier layer. The increase in the photoluminescence intensity or the carrier lifetime indicates that the crystalline quality is improved. So, when a superlattice structure having a thickness sufficiently thinner than the critical thickness at which dislocations occur is fabricated, the crystalline quality is improved by producing a superlattice layer comprising two kinds of layers having different strains in the same direction with respect to the substrate. Although a strain compensation type superlattice structure, like the MQW structure of the prior art semiconductor laser shown in FIG. 12, is effective in increasing the critical thickness, it does not improve crystalline quality. So, if the thickness of the superlattice layer is sufficiently thinner than the critical thickness, the crystalline quality at the growth interface is improved by successively growing crystalline layers so that the difference in lattice constants between adjacent layers becomes small, like the well layers 4a and the barrier layers 4b according to the first embodiment of the invention, whereby the crystalline quality of the superlattice layer is improved.

Since the MQW structure 4 in the active layer 50 according to the first embodiment of the invention comprises two kinds of layers having different strains in the same direction with respect to the substrate, i.e., tensile strains of different magnitudes, the crystalline quality of the MQW structure 4 is significantly improved, compared to the crystalline quality of the MQW structure of the prior art semiconductor laser.

As described above, according to the first embodiment of the present invention, since the MQW structure 4 of the active layer 50 comprises the barrier layers 4b which comprise a material having a tensile strain with respect to the substrate 1 and the well layers 4a which comprise a material having a tensile strain larger than the tensile strain of the barrier layers 4b, the crystalline quality of the strained MQW structure is significantly improved, resulting in a high quality semiconductor laser with desired characteristics.

In the first embodiment of the invention, the MQW structure 4 comprises, alternatingly laminated, four $(Al_{x3}Ga_{1-x3})_{y3}In_{1-y3}P$ ($0 \leq x3 \leq 0.2$, $y3=0.6$) well layers 4a and three $(Al_{x4}Ga_{1-x4})_{y4}In_{1-y4}P$ ($x4=0.5$, $y4=0.55$) barrier layers 4b, each having a prescribed strain with respect to the substrate 1. However, the strain in the well layers and the strain in the barrier layers can be controlled according to the design of the semiconductor laser.

In the first embodiment of the invention, emphasis has been placed upon an MQW structure in which tensile strains of different magnitudes are applied to well layers and barrier layers. However, a similar MQW structure in which compressive strains of different quantities are applied to well layers and barrier layers is within the scope of the present invention. Also in this case, since the difference in lattice constants between the well layer and the barrier layer is small, the crystalline quality of the MQW structure is improved.

[Embodiment 2]

Figure 5:
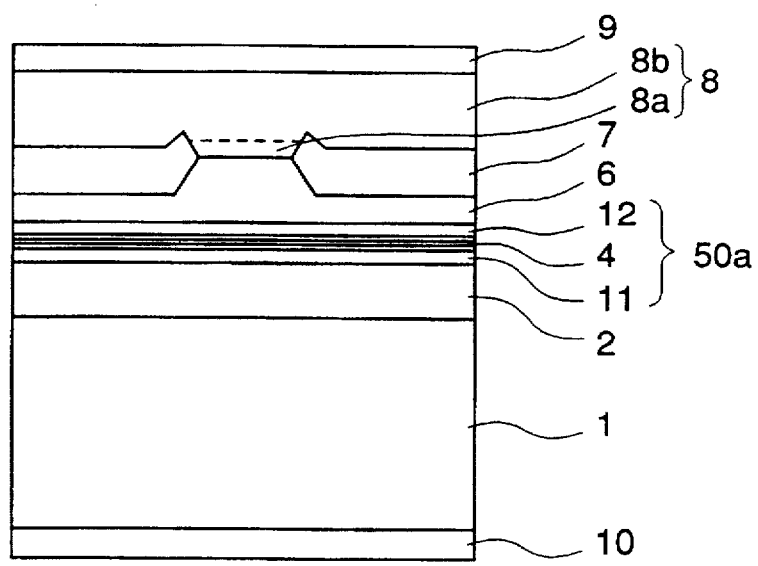
FIG. 5 is a cross-sectional view illustrating a semiconductor laser in accordance with a second embodiment of the present invention.

FIG. 5 is a cross-sectional view illustrating a semiconductor laser in accordance with a second embodiment of the present invention. In FIG. 5, the same reference numerals as those shown in FIG. 1 designate the same or corresponding parts. Reference numerals 11 and 12 designate $(Al_{x5}Ga_{1-x5})_{y5}In_{1-y5}P$ (x5=0.5, 0.45≦y5≦0.5) SCH layers. An MQW structure 4 is put between the SCH layers 11 and 12. An active layer 50a comprises the SCH layers 11 and 12 and the MQW structure 4. A tensile strain is applied to each of the SCH layers 11 and 12, and the tensile strain is gradually increased toward the MQW structure 4. In the SCH layer, the In composition 1-y at a part contacting the MQW structure 4 is 0.45 and the In composition 1-y at a part contacting the lower cladding layer 2 or the upper cladding layer 6 is 0.5. The method of fabricating the semiconductor laser according to this second embodiment is identical to the method already described with respect to the first embodiment except that the SCH layers 11 and 12 are grown by varying the In composition.

Figure 6:
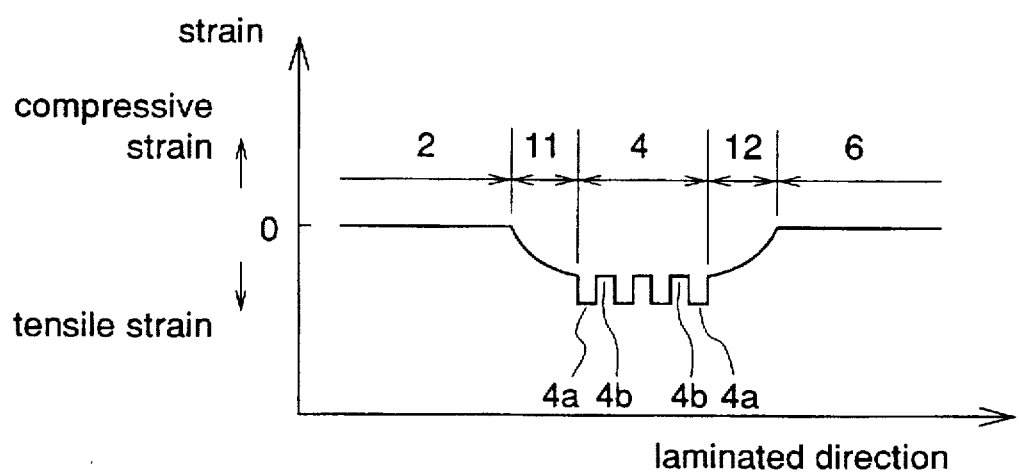
FIG. 6 is a schematic diagram for explaining a strain applied to an active layer and the vicinity in the semiconductor laser according to the second embodiment of the invention.

FIG. 6 is a schematic diagram for explaining a strain applied to the crystalline structure in the vicinity of the active layer 50a. In the figure, the same reference numerals as those in FIGS. 2 and 5 designate the same or corresponding parts. The abscissa shows the layer-laminated direction in the active layer 50a and the ordinate shows the strain applied to the active layer with respect to the substrate.

In the semiconductor laser according to this second embodiment, the difference in lattice constants between the MQW structure 4 and the SCH layers 11 and 12 contacting the MQW structure 4 is reduced to improve the crystalline quality of the MQW structure 4. More specifically, as shown in FIG. 6, the lattice constant of the SCH layers 11 and 12 is gradually decreased toward the well layer 4a of the MQW structure 4, in other words, the tensile strain is gradually increased toward the MQW structure 4, whereby the difference in lattice constants between the well layer 4a and the SCH layers 11 and 12 is reduced. As a result, the crystalline quality of the well layer 4a is improved. In addition, since the difference in lattice constants between the SCH layer 11 and the lower cladding layer 2 and the difference in lattice constants between the SCH layer 12 and the Upper cladding layer 6 are also reduced, unwanted lattice mismatch at the interface of the SCH layer and the cladding layer is avoided.

As described above, according to the second embodiment of the invention, since the tensile strain in the SCH layers 11 and 12 is gradually increased toward the MQW structure 4 by gradually decreasing the lattice constant of the SCH layers toward the MQW structure 4, the crystalline quality of the MQW structure 4 is significantly improved.

In this second embodiment of the invention, the lattice constant of the SCH layers 11 and 12 is gradually decreased by gradually varying the In composition of these layers. However, a similar structure including SCH layers sandwiching an MQW structure, each SCH layer comprising a plurality of layers having different lattice constants that are decreased stepwise toward the MQW structure, is also within the scope of the present invention.

Although in this second embodiment the gradual increase in the tensile strain toward the MQW structure is provided by gradually decreasing the lattice constant of the SCH layer 11 and the lattice constant of the SCH layer 12 toward the MQW structure, a gradual increase in the tensile strain may be provided by gradually decreasing the lattice constant of an upper portion of the lower cladding layer 2 and the SCH layer 11 and the lattice constant of a lower portion of the upper cladding layer 3 and the SCH layer 12 toward the MQW structure.

In this second embodiment of the present invention, tensile strains of different quantities are applied to the well layers 4a and the barrier layers 4b of the MQW structure 4, and a tensile strain is applied to the SCH layers 11 and 12 so that it is gradually increased toward the MQW structure 4. However, a similar structure in which compressive strains of different qualities are applied to the well layers and the barrier layers of the MQW structure and a compressive strain is applied to the SCH layers so that it is gradually increased toward the MQW structure, is also within the scope of the present invention.

Figure 17:
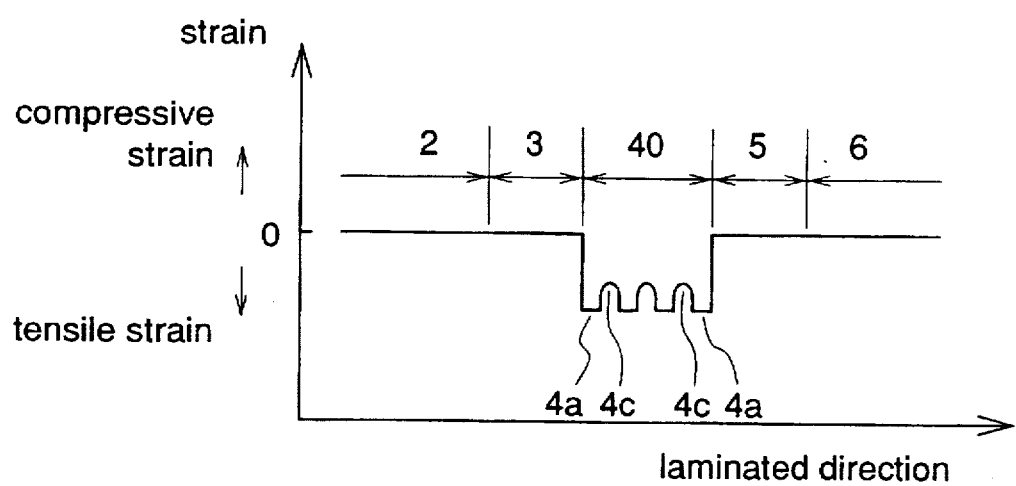
FIG. 17 is a schematic diagram for explaining a strain applied to an active layer and the vicinity in a semiconductor laser according to a modification of the second embodiment of the invention.

FIG. 17 is a schematic diagram for explaining a semiconductor laser in accordance with a modification of the second embodiment of the invention. In this modification, in place of gradually decreasing the lattice constant of the SCH layers toward the MQW structure as described above, an MQW structure 40 comprising alternating well layers 4a and barrier layers 4c is employed. More specifically, in the MQW structure 40, the lattice constant of each barrier layer 4c is gradually increased closer to the well layers 4a contacting both sides of the barrier layer 4c, in other words, the absolute value of the difference between the strain of the well layer 4a and the strain of the barrier layer 4c is gradually decreased in approaching closer to the well layer 4a. Also in this case, the same effects as provided by the second embodiment are obtained. Preferably, the barrier layer 4c comprises $(Al_{x6}Ga_{1-x6})_{y6}In_{1-y6}P$ (x6=0.5, 0.55≦y6≦0.6) in which the In composition 1-y6 is varied to vary the strain.

[Embodiment 3]

Figure 7:
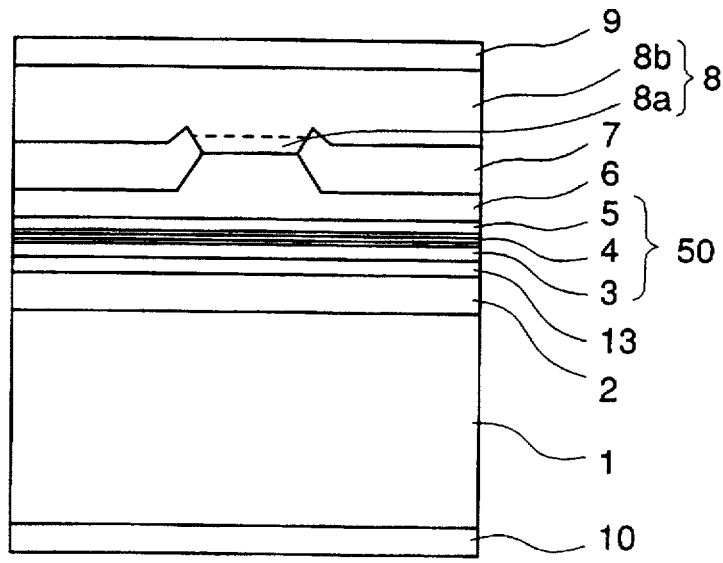
FIG. 7 is a cross-sectional view illustrating a semiconductor laser in accordance with a third embodiment of the present invention.

FIG. 7 is a cross-sectional view illustrating a semiconductor laser in accordance with a third embodiment of the present invention. In the figure, the same reference numerals as those shown in FIG. 1 designate the same or corresponding parts. The laser structure according to this third embodiment is identical to the laser structure according to the first embodiment except that a strain relaxing layer 13 is interposed between the lower cladding layer 2 and the SCH layer 3. The strain relaxing layer 13 is subjected to a strain in the opposite direction from the tensile strain applied to the MQW structure 4, i.e., a compressive strain is applied to the strain relaxing layer 13. Preferably, the strain relaxing layer 13 comprises $(Al_{x7}Ga_{1-x7})_{y7}In_{1-y7}P$ (x7=0.5, y7=0.4).

Figure 8:
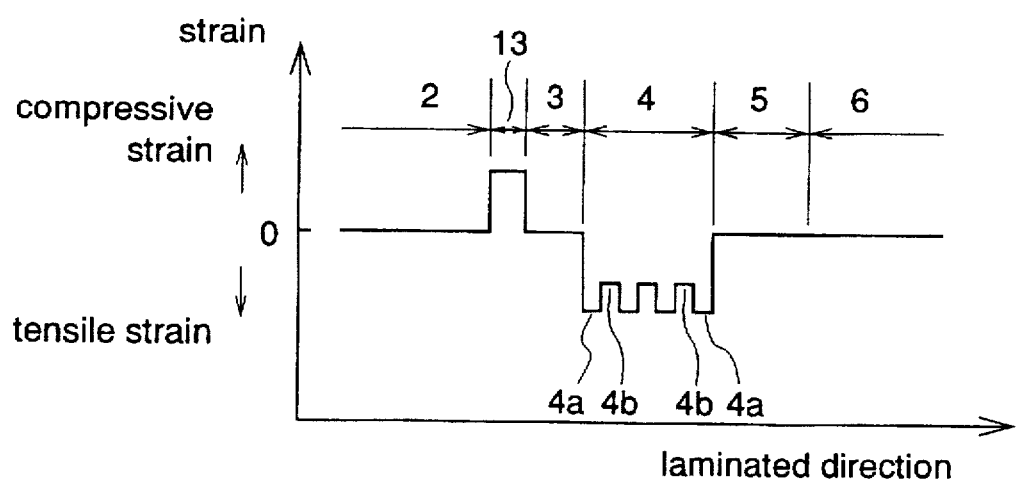
FIG. 8 is a schematic diagram for explaining a strain applied to an active layer and the vicinity in the semiconductor laser according to the third embodiment of the invention.

FIG. 8 is a schematic diagram for explaining a strain applied to the crystalline structure in the vicinity of the active layer 50 of the semiconductor laser shown in FIG. 5. In the figure, the same reference numerals as those shown in FIG. 2 and 7 designate the same or corresponding parts. The abscissa shows the layer-laminated direction in the active layer 50, and the ordinate shows the strain applied to the active layer 50 with respect to the substrate.

In the MQW structure 4 according to the first embodiment of the invention, since the well layers 4a and the barrier layers 4b are subjected to strains in the same direction, the total strain applied to the MQW structure 4 is larger than the strain applied to the MQW structure 31 of the prior art semiconductor laser. Therefore, the critical thickness of the MQW structure is reduced. In other words, the thickness of the MQW structure having no dislocations is reduced. In order to solve this problem, in this third embodiment, the strain relaxing layer 13 to which a strain is applied in the opposite direction from the strain of the MQW structure 4 is interposed between the lower cladding layer 2 and the SCH layer 3. As a result, the total strain applied to the MQW structure 4 is reduced.

More specifically, according to the third embodiment of the invention, in a laser structure according to the first embodiment of the invention, the strain relaxing layer 13 to which a compressive strain is applied, a strain opposed to the tensile strain applied to the MQW structure 4, is inserted between the lower cladding layer 2 and the SCH layer 3. Therefore, in addition to the same effects as provided by the first embodiment, the strain applied to the MQW structure 4 is reduced by the strain relaxing layer 13, whereby the strain applied to the crystalline structure in the vicinity of the active layer is reduced. As a result, the critical thickness of the MQW structure 4 is increased, and the degree of freedom in designing the semiconductor laser is increased.

While in the third embodiment of the invention the strain relaxing layer 13 is disposed between the lower cladding layer 2 and the SCH layer 3, the position of the strain relaxing layer 13 is not restricted thereto. For example, it may be disposed between the SCH layer 5 and the upper cladding layer 6, within the cladding layer 2 or 6, or within the SCH layer 3 or 5. Also in these cases, the same effects as provided by the third embodiment are obtained. The conductivity type of the strain relaxing layer 13 should be the same as the conductivity type of one of the semiconductor layers contacting the strain relaxing layer 13.

In this third embodiment of the invention, tensile strains of different quantities are applied to the well layers 4a and the barrier layers 4b of the MQW structure, and a compressively strained layer is employed as the strain relaxing layer 13. However, a similar structure in which compressive strains of different quantities are applied to the well layers and the barrier layers of the MQW structure and a tensively strained layer is employed as the strain relaxing layer is also within the scope of the present invention.

In the foregoing description, emphasis has been placed upon a semiconductor laser having a stripe-shaped ridge structure for concentrating current. However, the present invention may be applied to semiconductor lasers having other current concentrating structures with the same effects as provided by the first to third embodiments.

Further, in the foregoing description, emphasis has been placed upon a semiconductor laser including an n type substrate. However, a similar structure including a p type substrate is within the scope of the present invention.

Furthermore, in the foregoing description, emphasis has been placed upon a semiconductor laser comprising AlGaInP and related compound semiconductors. However, a similar structure comprising other compound semiconductors is also within the scope of the present invention.

[Embodiment 4]

Figure 9:
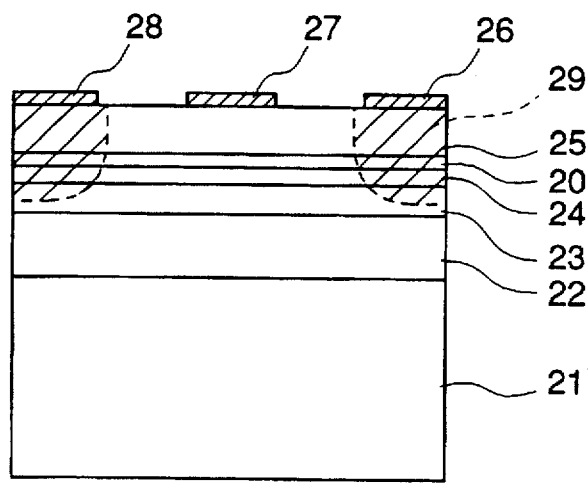
FIG. 9 is a cross-sectional view illustrating a HEMT in accordance with a fourth embodiment of the present invention.
Figure 10:
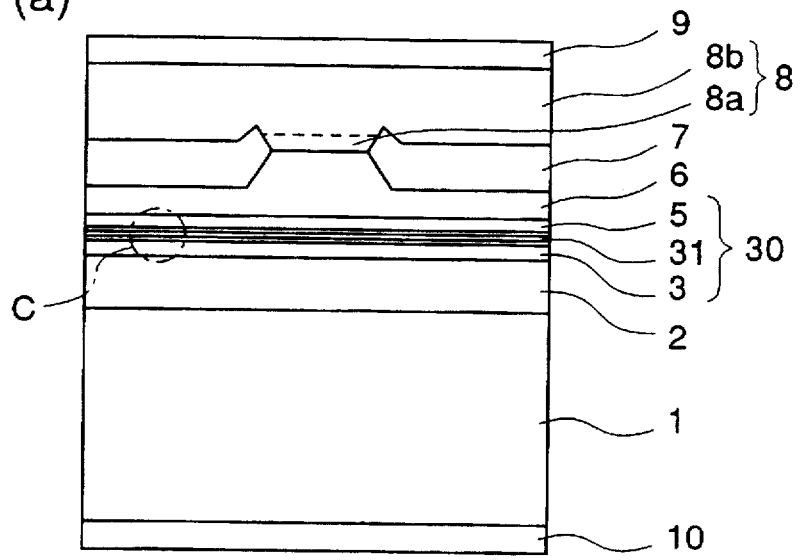
FIGS. 10(a) and (b) are cross-sectional views illustrating a semiconductor laser according to the prior art.
Figure 10:
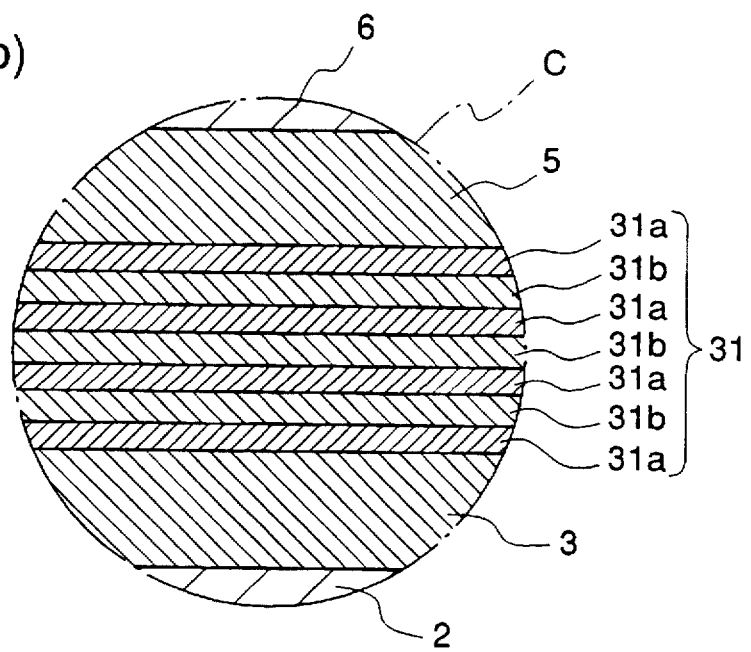
Figure 11:
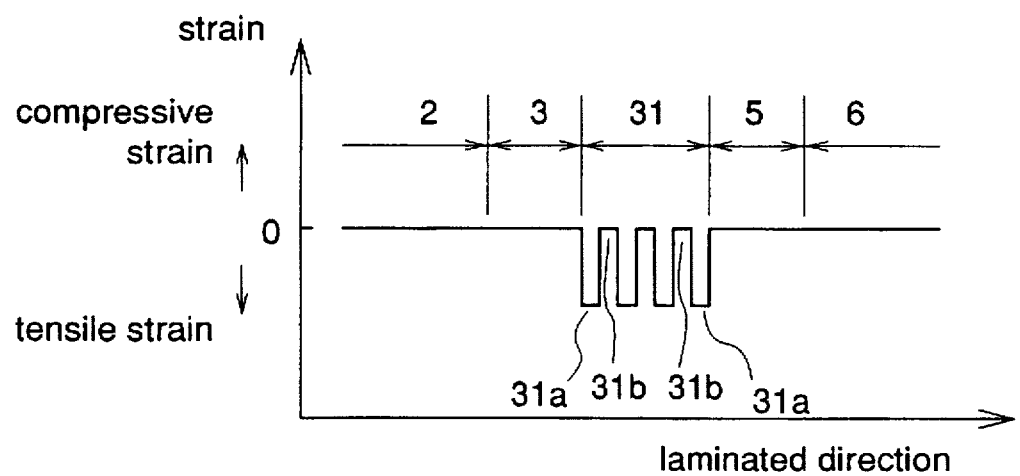
FIG. 11 is a schematic diagram for explaining a strain applied to an active layer and the vicinity in the semiconductor laser shown in FIG. 10.

FIG. 9 is a cross-sectional view illustrating a HEMT in accordance with a fourth embodiment of the present invention. This HEMT includes a semi-insulating GaAs substrate 21. An undoped GaAs buffer layer 22 is disposed on the substrate 21. An undoped GaAs electron transit layer 23 is disposed on the buffer layer 22. An undoped InGaAs pseudo electron transit layer 24 having a compressive strain with respect to the substrate 21 is disposed on the electron transit layer 23. An n type crystalline defect preventing layer 20 is disposed on the pseudo electron transit layer 24. The crystalline defect preventing layer 20 has a strain in the same direction as and smaller than the strain applied to the pseudo electron transit layer 24. Preferably, a GaAsSb layer including a very small amount of antimony (Sb) or an InGaAs layer with controlled In composition is employed as the crystalline defect preventing layer 20. An $n^+$ type AlGaAs electron supply layer 25 is disposed on the crystalline defect preventing layer 20. Ohmic regions 29 are created within the laminated structure, reaching into the electron transit layer 23. Preferably, the ohmic regions 29 are produced by ion implantation of Si. A gate electrode 27 is disposed on a center portion of the electron supply layer 25, making a Schottky contact with the electron supply layer 25. A source electrode 28 and a drain electrode 26 are disposed on the electron supply layer 25, contacting the ohmic regions 29.

A description is given of the method for fabricating the HEMT. Initially, the buffer layer 22, the electron transit layer 23, the pseudo electron transit layer 24, the crystalline defect preventing layer 20, and the electron supply layer 25 are successively grown on the substrate 21. Thereafter, the ohmic regions 29 are produced by ion implantation using a resist mask (not shown). Finally, the source electrode 28, the drain electrode 29, and the gate electrode 27 are produced by vacuum evaporation.

A description is given of the operation of the HEMT. This HEMT is a pseudomorphic HEMT including a pseudo electron transit layer 24 between an electron supply layer 25 and an electron transit layer 23. Electrons generated from donor impurities in the electron supply layer 25 are spatially separated from donor ions and accumulated in the pseudo electron transit layer 24 between the electron supply layer 25 and the electron transit layer 23 to produce a channel, and electrons traveling in the channel between the source electrode 28 and the drain electrode 26 are controlled with a voltage applied to the gate electrode 27. Since donor ions that prevent electrons from traveling are not present in the channel, a high mobility of electrons is realized. In addition, since the channel is produced in the In-added pseudo electron transit layer 24, the electron mobility of the HEMT is further increased.

Figure 16:
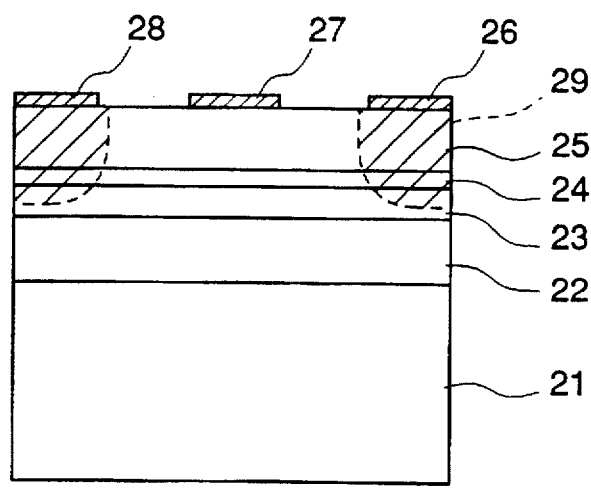
FIG. 16 is a cross-sectional view illustrating a HEMT according to the prior art.

In the HEMT according to the fourth embodiment of the invention, a 10 Å thick crystalline defect preventing layer 20 having a strain in the same direction as and smaller than the strain of the pseudo electron transit layer 24 is interposed between the electron supply layer 25 and the pseudo electron transit layer 24. In the prior art HEMT shown in FIG. 16, the electron mobility of the pseudo electron transit layer 24 is increased by adding In to GaAs. However, since the pseudo electron transit layer 24 does not lattice-match with the GaAs substrate 21, a strong compressive strain is applied to the pseudo electron transit layer 24, whereby the crystalline quality is degraded. As a result, a HEMT with desired characteristics is not realized.

In the HEMT according to the fourth embodiment of the invention, however, since the crystalline defect preventing layer 20 having a compressive strain smaller than the compressive strain of the pseudo electron transit layer 24 is disposed contacting the pseudo electron transit layer 24, the strain between the electron supply layer 25 and the crystalline defect preventing layer 20 and the strain between the crystalline defect preventing layer 20 and the pseudo electron transit layer 24 are made smaller than the strain between the electron supply layer 25 and the pseudo electron transit layer 24 of the prior art HEMT, whereby the crystalline quality of the pseudo electron transit layer 24 is improved.

As described above, according to the fourth embodiment of the invention, since the n type crystalline defect preventing layer 20 having a strain in the same direction as and smaller than the strain applied to the pseudo electron transit layer 24 is disposed between the electron supply layer 25 and the pseudo electron transit layer 24, the crystalline quality of the strained pseudo electron transit layer 24 is improved, resulting in a high-quality HEMT.

Figure 18:
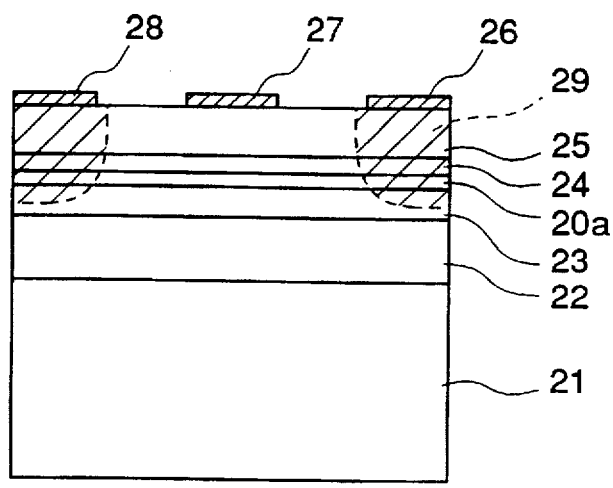
FIG. 18 is a cross-sectional view illustrating a HEMT in accordance with a modification of the fourth embodiment of the present invention.

FIG. 18 is a cross-sectional view illustrating an HEMT in accordance with a modification of the fourth embodiment of the invention. In the HEMT according to the fourth embodiment, an n type crystalline defect preventing layer 20 is disposed between the electrode supply layer 25 and the pseudo electron transit layer 24. However, in the HEMT according to the modification, an undoped crystalline defect preventing layer 20a is disposed between the pseudo electron transit layer 24 and the electron transit layer 23. The crystalline defect preventing layer 20a has a strain in the same direction as and smaller than the strain applied to the pseudo electron transit layer 24. Preferably, a GaAsSb layer including a very small amount of antimony (Sb) or an InGaAs layer with controlled In composition is employed as the crystalline defect preventing layer 20a. Also in this case, the same effects as provided by the fourth embodiment are obtained.

In this fourth embodiment of the invention, emphasis has been placed upon an HEMT including a compressively strained pseudo electron transit layer. However, a similar structure including a tensively strained pseudo electron transit layer is also within the scope of the present invention.

What is claimed is:

1. A semiconductor device including:

a semiconductor substrate having a surface; and a strained superlattice structure comprising a plurality of first semiconductor layers having a first strain in a direction with respect to the semiconductor substrate and a plurality of second semiconductor layers having a second strain in the same direction as and different in magnitude from the first strain, the first semiconductor layers and the second semiconductor layers being alternatingly laminated and a difference between the second strain and the first strain gradually decreases in absolute value from a second semiconductor layer toward an adjacent first semiconductor layer.

2. A semiconductor device including:

a semiconductor substrate having a surface;

a strained superlattice structure comprising a plurality of first semiconductor layers having a first strain in a direction with respect to the semiconductor substrate and a plurality of second semiconductor layers having a second strain in the same direction as and different in magnitude from the first strain, the first semiconductor layers and the second semiconductor layers being alternatingly laminated; and a third semiconductor layer in the vicinity of the strained superlattice structure, the third semiconductor layer being parallel to the surface of the substrate and having a third strain opposite in direction from the first strain.

3. A semiconductor laser comprising:

a semiconductor substrate of a first conductivity type and having opposed front and rear surfaces;

a first cladding layer of the first conductivity type disposed on the front surface of the semiconductor substrate, the first cladding layer having no strain with respect to the semiconductor substrate and having a band gap energy;

an active layer comprising a pair of separate confinement heterostructure layers disposed on the first cladding layer and a strained superlattice structure interposed between the separate confinement heterostructure layers, the separate confinement heterostructure layers comprising a material having a band gap energy smaller than the band gap energy of the first cladding layer, the strained superlattice structure comprising a plurality of well layers having a first strain in a direction with respect to the semiconductor substrate and a plurality of barrier layers interposed between the well layers and having a second strain in the same direction as and smaller than the first strain;

a second cladding layer of a second conductivity type, opposite the first conductivity type, disposed on the active layer and comprising the same material as the first cladding layer;

a contact layer of the second conductivity type disposed on the second cladding layer and having no strain with respect to the substrate;

a first electrode disposed on the substrate; and a second electrode disposed on the contact layer.

4. The semiconductor laser of claim 3 including the separate confinement heterostructure layers having a third strain in the same direction as the first strain, the third strain gradually increasing toward the strained superlattice structure.

5. The semiconductor laser of claim 3 wherein the barrier layers have a third strain the same direction as the first strain and a difference between the third strain and the first strain gradually decreases in absolute value toward the well layer.

6. The semiconductor laser of claim 3 including a strain relaxing layer in the vicinity of the strained superlattice structure, the strain relaxing layer being parallel to the surface of the substrate, having a third strain opposite in direction from the first strain, and comprising a semiconductor material having a conductivity type and an energy band gap identical to those of a semiconductor layer contacting the strain relaxing layer.

7. The semiconductor laser of claim 3 wherein the semiconductor substrate comprises first conductivity type GaAs, the first cladding layer comprises first conductivity type $(Al_{x1}Ga_{1-x1})_{y1}In_{1-y1}P$ ($0<x1<1$, $0<y1<1$) having no strain with respect to the semiconductor substrate, the separate confinement heterostructure layers comprise $(Al_{x2}Ga_{1-x2})_{y2}In_{1-y2}P$ ($0<x2\leq x1$, $y2=y1$, the well layers comprise $(Al_{x3}Ga_{1-x3})_{y3}In_{1-y3}P$ ($0<x3\leq x2$, $y2<y3<1$), the barrier layers comprise $(Al_{x4}Ga_{1-x4})_{y4}In_{1-y4}P$ ($x4=x2$, $y2<y4<y3$), the second cladding layer comprises second conductivity type $(Al_{x1}Ga_{1-x1})_{y1}In_{1-y1}P$, and the contact layer comprises second conductivity type GaAs.

8. A high electron mobility transistor comprising:

a semi-insulating substrate having a surface;

an undoped electron transit layer disposed on the surface of the semi-insulating substrate;

an undoped pseudo electron transit layer disposed on the electron transit layer and having a first strain in a direction with respect to the substrate;

an electron supply layer disposed on the pseudo electron transit layer and having a high concentration of a dopant impurity producing n type conductivity;

a gate electrode disposed on a portion of the electron supply layer, making a Schottky contact with the electron supply layer;

a source electrode and a drain electrode disposed on portions of the electron supply layer at opposite sides of and spaced apart from the gate electrode, making ohmic contacts with the electron supply layer; and an n type crystalline defect preventing layer interposed between the pseudo electron transit layer and the electron supply layer and having a second strain in the same direction as and smaller than the first strain.

9. The high electron mobility transistor of claim 8 wherein the substrate comprises semi-insulating GaAs, the electron transit layer comprises undoped GaAs, the pseudo electron transit layer comprises undoped InGaAs, the electron supply layer comprises AlGaAs having a high concentration of a dopant impurity producing n type conductivity, and the crystalline defect preventing layer is selected from the group consisting of n type GaAsSb including a very small amount of antimony and n type InGaAs in which the In composition is controlled to make the second strain smaller than the first strain.

10. A high electron mobility transistor comprising:

a semi-insulating substrate having a surface;

a undoped electron transit layer disposed on the surface of the semi-insulating substrate;

an undoped pseudo electron transit layer disposed on the electron transit layer and having a first strain in a direction with respect to the substrate;

an electron supply layer disposed on the pseudo electron transit layer and having a high concentration of a dopant impurity producing n type conductivity;

a gate electrode disposed on a portion of the electron supply layer, making a Schotty contact with the electron layer;

a source electrode and a drain electrode disposed on portions of the electron supply layer at opposite sides of and spaced apart from the gate electrode, making ohmic contacts with the electron supply layer; and an undoped crystalline defect preventing layer interposed between the pseudo electron transit layer and the electron transit layer and having a second strain in the same direction as and smaller than the first strain.

11. The high electron mobility transistor of claim 8 wherein the substrate comprises semi-insulating GaAs, the electron transit layer comprises undoped GaAs, the pseudo electron transit layer comprises undoped InGaAs, the electron supply layer comprises AlGaAs having a high concentration of an n type producing dopant impurity, and the crystalline defect preventing layer is selected from the group consisting of undoped GaAsSb including a very small amount of antimony and undoped InGaAs in which the In composition is controlled to make the second strain smaller than the first strain.

* * * * *